United States Patent [19]

Oda

[11] Patent Number: 5,904,981
[45] Date of Patent: May 18, 1999

[54] POLYCRYSTAL SILICON ROD HAVING AN IMPROVED MORPHOLOGY

[75] Inventor: Hiroyuki Oda, Tokuyama, Japan

[73] Assignee: Tokuyama Corporation, Yamaguchi-Ken, Japan

[21] Appl. No.: 09/084,421

[22] Filed: May 27, 1998

[51] Int. Cl.⁶ .............................. D02G 3/00; C01B 33/02
[52] U.S. Cl. .......................... 428/364; 423/348; 423/349
[58] Field of Search ............................. 428/364; 423/348, 423/349

[56] References Cited

U.S. PATENT DOCUMENTS

| 4,094,730 | 6/1978 | Rahilly ..................................... 156/606 |
| 4,150,168 | 4/1979 | Yatsurugi et al. ...................... 423/349 |
| 4,255,463 | 3/1981 | Rucha et al. . |
| 4,886,647 | 12/1989 | Ikeda et al. .............................. 422/250 |
| 5,499,598 | 3/1996 | Oda ........................................... 117/49 |

FOREIGN PATENT DOCUMENTS 55-16000  2/1980  Japan .

*Primary Examiner*—Newton Edwards
*Attorney, Agent, or Firm*—Birch, Stewart, Kolasch & Birch, LLP

[57] ABSTRACT

A cylindrical polycrystal silicon rod formed of a high-purity polycrystal silicon, characterized in that a crystal having a grain diameter smaller than that of a crystal at a location where the distance from the center of deposition is 50% of the length from the center of deposition is existent in an area where the distance from the center of deposition toward the periphery is more than 50% of the length in the same lengthwise direction.

3 Claims, 1 Drawing Sheet

POLYCRYSTAL SILICON ROD HAVING AN IMPROVED MORPHYOLOGY

BACKGROUND OF THE INVENTION

The present invention relates to a polycrystal silicon rod. More specifically, it relates to a polycrystal silicon rod formed of a high-purity polycrystal silicon of a semiconductor grade having a reduced number of surface pores.

The most common process for producing a high-purity polycrystal silicon comprises the steps of heating a filament of a high-purity silicon with an electric current to cause a reaction of trichlorosilane on the filament, thereby depositing a rod-shaped polycrystal silicon.

In the deposition of polycrystal silicon, a factor having the greatest influence on its productivity is deposition speed. It has been known that the higher the deposition temperature is, the higher the deposition speed of polycrystal silicon is. However, it has also been known that when the deposition temperature is increased, the morphology of the surface of a deposited rod is degraded and the silicon rod surface has objects very similar in shape and size to a popcorn. Polycrystal silicon having a bad morphology (to be simply referred to as "popcorn" hereinafter) easily takes in impurities, an etching solution tends to remain after etching, and pores exist inside the polycrystal silicon, and in consequence, an adverse effect is exerted on monocrystals in particular at the time of pulling up the monocrystals and monocrystals not desirable as a product are produced. Because of the above reasons, the deposition temperature cannot be increased much. JP-A 55-16000 (the term "JP-A" as used herein means an "unexamined published Japanese patent application") describes that the throughput and the morphology of polycrystal silicon conflict with each other.

SUMMARY OF THE INVENTION

It is known that the formation of popcorn on the surface of a polycrystal silicon rod can be prevented by increasing the molar ratio of chlorosilane contained in a deposited gas. Therefore, a countermeasure so far taken is to inhibit the formation of popcorn by controlling the molar ratio of chlorosilane in a deposited gas. However, when the molar ratio is increased, silicon tetrachloride is by-produced in large quantities and the trichlorosilane consumption lowers. On the other hand, the deposition speed further increases when the temperature of polycrystal silicon rod having the same molar ratio is increased, whereby the productivity of polycrystal silicon can be improved. Therefore, the development of a deposition method which can prevent the formation of popcorn at a deposition temperature higher than usual has been desired.

The inventor of the present invention has made studies on the mechanism of the formation of popcorn and succeeded in elucidating the mechanism. The present inventor has found a deposition technology which prevents the formation of popcorn even at a deposition temperature higher than before by excluding one of the factors forming popcorn, and thus, have attained the present invention.

That is, the present invention relates to a high-purity polycrystal silicon rod having a cylindrical shape, characterized in that a crystal having a grain diameter smaller than that of a crystal at a location where the distance from the center of deposition to the periphery is 50% of the length from the center of deposition to the periphery is existent in an area where the distance from the center of deposition toward the periphery is more than 50% of the length in the same lengthwise direction.

BRIEF DESCRIPTION OF THE ACCOMPANYING DRAWINGS

Figure 1:
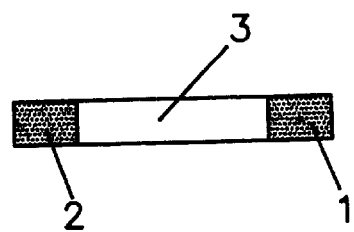
FIG. 1 is a schematic sectional view of a silicon test piece for checking the deposition speed of polycrystal and single crystal silicon.

In the above figures, reference numeral 1 denotes polycrystal silicon, 2 polycrystal silicon, 3 single crystal silicon, 4 polycrystal silicon, 5 deposited silicon and 6 deposited silicon.

DETAILED DESCRIPTION OF THE INVENTION

The present inventor has closely observed the formation process of popcorn and have found that popcorn is formed by local differences in deposition speed. That is, small concave and convex portions are first formed by the local differences in deposition speed, and a deposited gas becomes then difficult to reach the concave portions, thereby reducing the deposition speed. On the other hand, the gas blows well against the convex portions, thereby further increasing the deposition speed. It has been revealed that popcorn is thus formed due to large local differences in deposition speed.

The present inventor has further studied what causes the differences in initial deposition speed, and have found that the deposition speed is high in a portion where a large number of crystal grain boundaries are present. Based on the finding, it is assumed that the deposition speed is low in a portion where large crystal grains exist while the deposition speed is high in a portion where small crystal grains exist. That is, it is assumed that the difference in size of crystal grains causes the local differences in deposition speed in the formation of popcorn.

Figure 2:
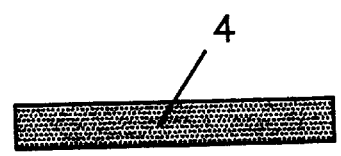
FIG. 2 is a schematic sectional view of a silicon test piece for checking the deposition speed of polycrystal silicon.
Figure 3:
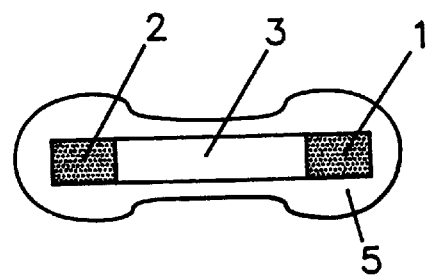
FIG. 3 is a schematic sectional view of the test piece of FIG. 1 which has silicon layer deposited thereon.
Figure 4:
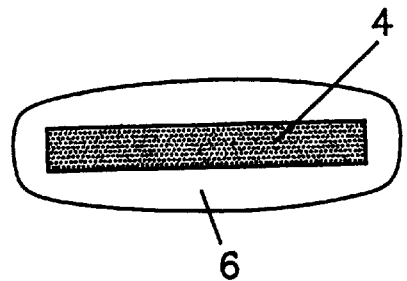
FIG. 4 is a schematic sectional view of the test piece of FIG. 2 which has polycrystal silicon layer deposited thereon.

To confirm the validity of the above assumption, experiments in which polycrystal silicon was deposited on the surfaces of the test pieces shown in FIG. 1 and FIG. 2 were conducted. In the test piece of FIG. 1, a center and its vicinity portion is composed of single crystal 3 and both side portions are composed of polycrystal 1 and having a grain diameter of 20 $\mu$m or less. The test piece of FIG. 2 was totally made from polycrystal 4 having a grain diameter of 20 $\mu$m or less. FIG. 3 and FIG. 4 show the shapes of the above test pieces on which polycrystal silicon was deposited at 1,050° C., respectively. Denoted by 5 in FIG. 3 and 6 in FIG. 4 is a deposited silicon. That is, it was confirmed that the deposition speed was low in the single crystal portions and high in the polycrystal portions. It is relatively easy to imagine that when the deposition of polycrystal silicon on the test piece of FIG. 3 is continued, the both side portions of the test piece will further swell and popcorn will be formed. The present inventor has studied the results of the above experiments and has reached the following conclusions.

It is assumed that the growth process of crystals consists of repetitions of the following phenomenon when seen in a microscopic level. Silicon molecules produced by the partial decomposition of trichlorosilane molecules are adhered to base silicon. Thereafter, the silicon molecules spread over the surface of the base silicon and settle at a certain location, that is, a trapping site. It is assumed that the base silicon, that is, the silicon rod grows as a whole, as a large number of silicon molecules repeat this process. The base silicon, that is, the silicon rod used first as a filament material preferably has a diameter of 2 to 10 mm. It can be easily imagined that when the silicon rod grows, the number of trapping sites is larger in an irregular gap between crystals, that is, in a grain boundary existing around the crystal grain than in the smooth crystal. It can also be imagined that an attraction force for silicon molecules is larger at a grain boundary having a large strain than in a stable crystal. Thus, it is assumed that the deposition speed is higher in the boundary of a crystal than in the center of a grain. There is virtually no problem when the crystal grains are small, but there appear larger differences in deposition speed as the grain diameter of a crystal grain becomes larger, thereby inducing the formation of popcorn. It was confirmed by the experiments that the higher the deposition temperature is the larger the grain diameter of polycrystal silicon becomes. Based on this, it was also confirmed that the higher the deposition temperature is, the larger popcorn areas are formed.

The present inventor has found, based on the point of view supported by the above experiments, that the formation of new trapping sites about the middle of a crystal grain before its central portion dents is effective in suppressing the formation of popcorn even when a large crystal grain is formed. To form new trapping site, it is preferred to utilize collision between silicon molecules. Silicon molecules, for example, surface dispersed $SiH_2$ molecules are thought to have a high mobility when they are alone. A dimer formed by the collision and bonding of the same molecules has a low mobility and can form a trapping site.

To promote the collision of molecules, various methods can be used. Of these, a method in which the deposition temperature is lowered to decrease diffusion coefficient of surface molecules so as to increase the density of surface molecules before they are absorbed to trapping sites is the most convenient. A method in which the concentration of chlorosilane contained in a deposited gas, that is, the molar ratio is raised to increase the absolute number of surface molecules only for a short period of time during which new trapping sites are formed in a crystal can also be used. Further, a method in which the pressure is raised to increase the amount of trichlorosilane molecules adsorbed to the surface of base silicon can also be used.

In any one of the above methods, the polycrystal silicon rod in which trapping sites have been intentionally formed in crystal grains inevitably has a reduced grain diameter in the portion where such operation has been carried out. The term "crystal having a smaller grain diameter" as referred to in the present invention means a crystal at a portion where the above operation has been carried out. Not only polycrystal silicon but also crystals which grow generally by a chemical vapor deposition (CVD) become large in grain diameter as they grow or maintain a constant grain diameter. A portion of crystals where a trapping site is not yet formed is smaller than its portion where a trapping site has been formed to trigger new crystal growth.

A description is subsequently given of a means of measuring the grain diameter. To measure the grain diameter of polycrystal silicon, the observation of its structure through a microscope is the most accurate means. A cylindrical polycrystal silicon rod is cut in round slices in a direction perpendicular to a longitudinal direction to expose its section that allows the observation of a growing direction of crystals. The section is polished and etched with a mixture of hydrofluoric acid and nitric acid and observed with an optical microscope or a secondary electron image of a scanning electron microscope. At this point, a crystal grain looks like a plane and a grain boundary looks like a line encircling the crystal grain in the view field of the microscope. Crystal grains are partitioned by a grain boundary and the grain boundary of polycrystal silicon is not usually linear. A twin boundary and laminate defect are similar to the crystal grain boundary but the former is ones formed by reversing the regularity of crystal alignment around the plane. Therefore, they are coherent as a crystal and has no effect as a trapping site. Since these are seen as a straight line through a microscope, they can be easily discriminated from the grain boundary.

To measure the grain diameter of a crystal at 50% of the length from the center of deposition in a radial direction, the center of deposition on the sliced cylindrical rod is first determined. This position may be slightly different from the center of the sliced rod, but it can be easily determined when the growing direction of a crystal is observed. Thereafter, the length from the center of deposition to the periphery surface of the rod, that is, the thickness of deposition is measured. Then, a circular arc is drawn in a direction perpendicular to a direction from the center toward the periphery surface at a location where the distance from the center toward the periphery surface is 50% of the length. The arc agrees with the surface of deposition at a certain point of time. The width of a crystal grain which this arc crosses indicates the size of a crystal exposed to the surface when the arc agrees with the surface of the rod. The grain diameter of a crystal at a certain point of time can be obtained by measuring the distance between points where adjacent grain boundaries observed as linear and the arc cross each other.

The crystal as used in the present invention is not a small crystal but a crystal grain having a large grain diameter. Therefore, in the present invention, the grain diameter of a crystal is defined as follows. The above circular arc is divided into a predetermined length at arbitrary locations, five crystal grains having a larger width out of crystal grains which the divided arc crosses are selected, and the grain diameters of these crystals are averaged. The same operation is carried out at other several arbitrary locations of the arc. The average values at different locations are further averaged and the thus obtained value is defined as the grain diameter of a crystal in that portion.

When a plurality of polycrystal silicon rods are placed upright in a reactor to conduct the deposition of silicon, popcorn is more liable to be formed on the surface of a rod which has grown to a certain degree after the intermediate point of deposition than that of a slender rod at the beginning of deposition. This is not only because the grain diameter of a crystal gradually increases but also because the gas is further heated by the increasing heat radiation quantity of the rod. It is also because a portion where the molar ratio of chlorosilane is partially decreased is formed as the rod becomes thick to narrow the passage of a gas. Under the circumstances, a trapping site is newly formed after the intermediate point of deposition rather than the beginning of deposition, for example, in an area where the distance from the center toward the periphery in a radial direction is more than 50%, preferably more than 60%, more preferably 60 to 95%, particularly preferably 70 to 90% of the diameter, in terms of the diameter of the polycrystal silicon rod. Since the operation of forming new trapping site is carried out over the entire rod, a change in the grain diameter of a crystal occurs uniformly on the circumference of the cross-section of the rod and in a longitudinal direction of the rod. As a result, crystals having a grain diameter different from that at a location where the distance from the center is 50% of the length are formed in the above area in both circumferential direction and longitudinal direction of the rod.

The operation of forming new trapping site does not need to be carried out for a long time. The object of the present invention is attained if crystals having a large grain diameter disappear. However, if the operation is carried out for an extremely short period of time, strain is liable to concentrate at a location where the crystal grain diameter is extremely different and hence, the rod becomes liable to crack. To prevent this, the operation is preferably carried out, based on a change in the crystal grain diameter of a crystal, to such an extent that the grain diameter of crystals having a grain diameter smaller than that of a crystal at a location where the distance from the center of deposition is 50% of the length from the center is 20 to 80%, preferably 30 to 70%, more preferably 40 to 60%, of the grain diameter of the crystal at a location where the distance from the center of deposition is 50% of the length from the center.

As described above, concrete means for forming new trapping site is not particularly limited. The most simple method of reducing the deposition temperature is to reduce a current value used as heating means. In this case, a drastic temperature change causes an increase in strain in the rod disadvantageously. As the diameter of the rod continues to increase during deposition, the current value is generally controlled to increase as the diameter grows to maintain its temperature. Therefore, the temperature of the rod can be eventually reduced by stopping increasing of the current value when it reaches a certain value without lowering the current value intentionally.

The above method can be applied to only a rod on which popcorn is apt to be formed or only a power source system including such a rod in a single reactor or to the whole rod in the reactor. When three or more deposition reactors are installed, the deposition reactors are operated sequentially according to a predetermined plan in order to minimize the capacity of a main transformer which serves as a power source for the reactors. In this case, fluctuations in the value of a current supplied from the main transformer can be absorbed by employing the current limitation of the present invention effectively. For example, when the operation plan does not work well and the change of the process is required, a current is kept at a constant value for one reactor for a period of time during which the present invention is carried out, that is, until the operation of another reactor requiring a large current is completed, and then returned to the optimal value so that a change in the maximum current value based on the change of the process can be absorbed. The formation of popcorn and a reduction in the power of a whole reaction system can be prevented by this process. In this case, it is effective to apply the present invention to a reactor containing a rod having an increased diameter as much as possible in limits that the formation of popcorn is suppressed.

The following examples are given to further illustrate the present invention.

EXAMPLE 1

Deposition of polycrystal silicon was carried out in accordance with a known method per se by reacting purified trichlorosilane with hydrogen by a Siemens method, using a polycrystal silicon rod having a diameter of 5 mm as a filament for depositing polycrystal silicon and maintaining the surface temperature of the rod at 1,030° C. When the diameter of the rod became 85 mm, an electric current was stopped from increasing and kept constant thereafter. When the surface temperature reached 970° C., the surface temperature of the rod was returned to 1,030° C. again. The operation of returning the surface temperature to 1,030° C. was carried out slowly over 30 hours. When the diameter of the rod became 120 mm, deposition was terminated. The deposition speed of the polycrystal silicon rod was 61 kg/hr. The popcorn formation rate was 13%. The term "popcorn formation rate" is a value obtained by dividing the number of rods having popcorns formed in portions other than a bridge portion by the total number of rods. After the end of deposition, the silicon rod was cut in round slices to measure the grain diameter of a crystal. The result is shown in Table 1.

Comparative Example 1

Deposition of polycrystal silicon was carried out in the same manner as in Example 1 except that the surface temperature of the polycrystal silicon rod was maintained at 1,030° C. all the time. Deposition was terminated when the diameter of the polycrystal silicon rod became 120 mm. The popcorn formation rate was 90%. The result is shown in Table 1.

Comparative Example 2

Deposition of polycrystal silicon was carried out in the same manner as in Example 1 except that the surface temperature of the polycrystal silicon rod was maintained at 1,000° C. all the time. Deposition was terminated when the diameter of the polycrystal silicon rod became 120 mm. The popcorn formation rate was 17%. The deposition speed of the polycrystal silicon rod was 53 kg/hr. This deposition speed is 13% lower than the deposition speed of Example 1. Thus, the production efficiency is low. The result is shown in Table 1.

TABLE 1

| location from center of deposition in radial direction | grain diameter ($\mu$m) | | |
| --- | --- | --- | --- |
| | location at 50% | location at 75% | location at 100% |
| Example 1 | 300 | 100 | 300 |
| Comparative Example 1 | 300 | 450 | 600 |
| Comparative Example 2 | 150 | 200 | 300 |

According to the present invention, there is provided a polycrystal silicon rod formed of a high-purity polycrystal silicon of a semiconductor grade having a reduced number of surface pores (popcorn).

What is claimed is:

1. A cylindrical polycrystal silicon rod formed of a high-purity polycrystal silicon, characterized in that a crystal having a grain diameter smaller than that of a crystal at a location where the distance from the center of deposition is 50% of the length from the center of deposition is existent in an area where the distance from the center of deposition toward the periphery is more than 50% of the length in the same lengthwise direction.

2. The polycrystal silicon rod of claim 1, wherein the grain diameter of a crystal having a grain diameter smaller than that of a crystal at a location where the distance from the center of deposition is 50% of the length from the center of deposition is 20 to 80% of the grain diameter of the crystal at a location where the distance from the center of deposition is 50% of the length from the center of deposition.

3. The polycrystal silicon rod of claim 1, wherein a crystal having a grain diameter smaller than that of a crystal at a location where the distance from the center of deposition is 50% of the length from the center of deposition to the periphery is existent in an area where the distance from the center is 60 to 95% of the length in the same lengthwise direction.

* * * * *